(12) United States Patent  
Teruya et al.

(10) Patent No.: US 7,378,830 B2  
(45) Date of Patent: May 27, 2008

(54) MINIATURE MODIFIED FARADAY CUP FOR MICRO ELECTRON BEAMS

(75) Inventors: Alan T. Teruya, Livermore, CA (US); John W. Elmer, Danville, CA (US); Todd A. Palmer, Livermore, CA (US); Chris C. Walton, Berkeley, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 256 days.

(21) Appl. No.: 11/166,716

(22) Filed: Jun. 23, 2005

(65) Prior Publication Data

US 2008/0088295 A1    Apr. 17, 2008

Related U.S. Application Data

(60) Provisional application No. 60/583,166, filed on Jun. 24, 2004.

(51) Int. Cl.  
*G01N 27/00* (2006.01)

(52) U.S. Cl. .................... 324/71.3; 324/76.11; 324/751

(58) Field of Classification Search ............... 324/71.3, 324/76.11, 751  
See application file for complete search history.

(56) References Cited

U.S. PATENT DOCUMENTS

| | | |
|---|---|---|
| 5,382,895 A | 1/1995 | Elmer et al. |
| 5,468,966 A | 11/1995 | Elmer et al. |
| 5,554,926 A | 9/1996 | Elmer et al. |
| 5,583,427 A | 12/1996 | Teruya et al. |
| 6,300,755 B1 | 10/2001 | Elmer et al. |
| 2004/0026627 A1 | 2/2004 | Nakayama et al. |

OTHER PUBLICATIONS

Elmer, J. W., et al., "An Enhanced Faraday Cup for Rapid Determination of Power Density Distribution in Electron Beams," Welding Journal, 80 (12), pp. 288s-295s, Dec. 2001.

Elmer, John W., et al, "Beam Profile Analysis for the C&MS B231 Electron Beam Welding Machines," Lawrence Livermore National Laboratory, LLNL UCRL-IS-127549, Jun. 12, 1997.

Elmer, J. W., "Fast Method for Measuring Power Density Distribution of Non-Circular and Irregular Electron Beams," Science and Technology of Welding and Joining, vol. 3, No. 2, pp. 51-58, 1998.

Teruya, Alan, et al., "A System for the Tomographic Determination of the Power Distribution in Electron Beams," The Laser and Electron Beam in Welding, Cutting, and Surface Treatment State-of-the-Art 1991, Bakish Materials Corp., pp. 125-140, 1991.

Elmer, J. W., et al., "Tomographic Imaging of Noncircular and Irregular Electron Beam Current Density Distributions," Welding Journal 72 (ii), pp. 493s-505s, Nov. 1993.

*Primary Examiner*—Vincent Q. Nguyen  
(74) *Attorney, Agent, or Firm*—Eddie E. Scott; John H. Lee

(57) ABSTRACT

A micro beam Faraday cup assembly includes a refractory metal layer with an odd number of thin, radially positioned traces in this refractory metal layer. Some of the radially positioned traces are located at the edge of the micro modified Faraday cup body and some of the radially positioned traces are located in the central portion of the micro modified Faraday cup body. Each set of traces is connected to a separate data acquisition channel to form multiple independent diagnostic networks. The data obtained from the two diagnostic networks are combined and inputted into a computed tomography algorithm to reconstruct the beam shape, size, and power density distribution.

33 Claims, 3 Drawing Sheets

MINIATURE MODIFIED FARADAY CUP FOR MICRO ELECTRON BEAMS

CROSS-REFERENCE TO RELATED APPLICATIONS

This application claims the benefit of U.S. Provisional Patent Application No. 60/583,166 by Alan T. Teruya, John W. Elmer, Todd A. Palmer, and Chris C. Walton filed Jun. 24, 2004 and titled "An Improved Miniature Modified Faraday Cup for Micro Electron Beams." U.S. Provisional Patent Application No. 60/583,166 filed Jun. 24, 2004 is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to electron beams and more particularly to a diagnostic system for profiling micro-beams.

2. State of Technology

U.S. Pat. No. 6,300,755 for enhanced modified faraday cup for determination of power density distribution of electron beams issued to John W. Elmer and Alan T. Teruya Oct. 9, 2001 provides the following state of technology information, "Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact that many welds are made over a period of time and with different welding operators. Further complications arise when welds are developed on one machine than transferred to a different machine for production. An electron beam diagnostic method has been developed that enables the precise characterization of the power density distribution in high power electron beams. Such diagnostic method, which utilizes a modified Faraday cup, is exemplified by U.S. Pat. No. 5,382,895, U.S. Pat. No. 5,468,966, U.S. Pat. No. 5,554,926 and U.S. Pat. No. 5,583,427. This electron beam diagnostic method has been utilized, for example, to certify changes in electron beam welders, and is further described in J. W. Elmer et al, "Tomographic Imaging of Non-Circular and Irregular Electron Beam Power Density Distributions," Welding Journal 72 (ii), p. 493-s, 1993; A. T. Teruya et al, "A System for the Tomographic Determination of the Power Distribution in Electron Beams," The Laser and Electron Beam in Welding, Cutting, and Surface Treatment State-of-the-Art 1991, Bakish Materials Corp., p. 125, 1991; and J. W. Elmer et al, "Beam Profile Analysis for the C&MS B231 Electron Beam Welding Machines," LLNL UCRL-ID-127549, Jun. 12, 1997."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system for characterization of a micro beam. The system includes methods and apparatus for capturing multiple beam profiles at different radial angles in a fraction of a second as the beam is oscillated in a circular pattern over the apparatus. Each beam profile is captured by a radial trace at the bottom of a narrow slit that allows only a small portion of the micro beam to pass through and be captured by the trace. The individual beam profiles are then reconstructed using a computed tomography method to render an image of the beam shape, size, and power density distribution. The quality of the reconstructed beam image is further enhanced by increasing the number of profiles obtained by the diagnostic tool. The present invention increases the number of profiles taken in one oscillation of the beam by interleaving one or more set(s) of current collecting traces within the first set of current collecting traces. As a result, the device is capable of collecting twice as much (or more) profile data in one oscillation of the beam. These electrically isolated traces are placed at the bottom of recesses in a layer in order to prevent cross-talk from backscattered electrons. The current collected by each set of traces is individually recorded by a dedicated data acquisition channel. The preprocessing portion of the computed tomography software combines the profiles from the various channels into a form suitable for performing the computed tomography reconstruction.

Apparatus of the system comprises a micro modified Faraday cup assembly positioned in the path of the micro beam. The micro modified Faraday cup assembly is comprised of multiple material layers placed in intimate contact. A refractory metal layer is placed on the top, with alternating layers of insulating and conducting materials placed below it. Two or more sets of radially positioned slits penetrate the top refractory metal layer. Below each set of slits in the refractory metal layer are traces placed in the bottom of the recesses in one of the conductive layers. Aligned slits in the layers between the refractory metal layer and the conductive layer containing the traces allow electrons to travel to and be collected by the traces. Each set of radially positioned traces contains an odd number of uniformly spaced traces and is independently connected to a dedicated data acquisition system. These multiple sets of radial traces are positioned in such a way that as the beam is deflected in a circle of a given diameter on the refractory metal layer, the beam passes perpendicularly across each trace.

In the embodiment of the micro diagnostic device described here, two sets of interleaved traces are considered. Each set consists of the same odd number of traces equally spaced around the circumference of the refractory metal layer. The first set of radial traces begins at the edge of the refractory metal layer and extends towards the center. The second set of traces begins in the center of the refractory metal layer and extends towards the edge and is interleaved within the first set of traces. Since each set of traces is independently connected to a dedicated data acquisition system, two independent diagnostic networks are formed. With both traces displaying the same uniform angular spacing, the interleaving of the two sets of traces is done by placing one of the traces from the inner set a quarter of the angular distance from a corresponding trace in the outer set. As a result, the inner and outer sets are separated by an alternating pattern with angles 25% and 75% of the uniform angular spacing of each set of traces.

In the method of the present invention, electron beam deflection coils sweep the beam in a circle of known diameter and at a constant frequency over the radially positioned traces located at the edge of the micro modified Faraday cup body and over the radially positioned traces located in the central portion of the micro modified Faraday cup body. Individual portions of the beam current pass through the various traces and are detected by both diagnostic networks. Current versus time profiles can be captured as the beam passes over each trace using a fast sampling analog to digital converter. This beam profile information can be stored on a computer, which uses CT to reconstruct the power density distribution in the beam.

This system allows the interleaving of at least a second set of radial traces that collect beam current data independent of the first set and read by a second DAQ device channel. Because the two sets of data are independent, it does not matter if the two adjacent traces are sampling different portions of the beam simultaneously. As long as the profiles on a single DAQ device channel do not overlap, it will be possible to reconstruct the beam power density distribution. The data from the two channels is then combined for the CT reconstruction. It is also possible to interleave three or more sets of radial traces that collect beam current.

The present invention has uses for characterization of micro electron beams used for electron microscopy (scanning or transmission), for micro charged particle beams used for micro-joining applications, and for micro ion beams or focused ion beams used for ion implantation or characterization. The present invention can be used for characterization of any charged particle beams used for lithography, or ion implantation on a micro scale.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
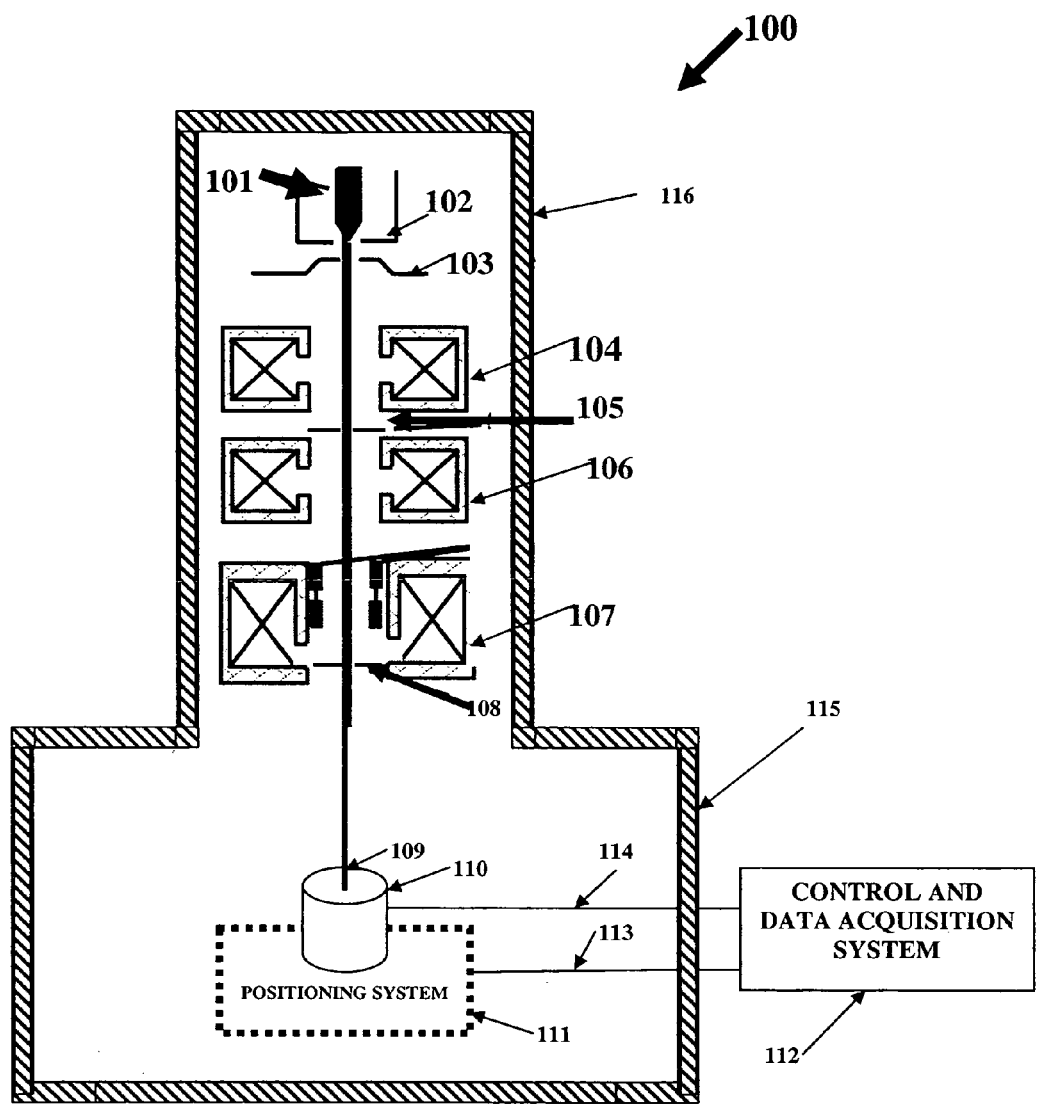
FIG. 1 is a general illustration of one embodiment of a diagnostic system for micro beams constructed in accordance with the present invention.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Many of the diagnostic methods for measuring the power density distribution in electron beams are variations of the traditional Faraday cup, which consists of an electrically conductive trap to measure the beam current. More detailed characteristics of the beam, such as the power density distribution, can be obtained by modifying the Faraday cup so that only a portion of the beam enters the cup at any one time.

In one modification, a single slit or knife-edge is placed above the Faraday cup while the beam is swept over this slit or knife-edge. This technique measures the beam current along the sweep direction and provides a one-dimensional profile of the beam along the sweep direction and is useful for inspecting beams with radial symmetry. If the beam is non-circular or has an irregular power distribution, more sophisticated techniques are required to map the power density distribution in the beam.

Pinhole devices have also been used to measure the power distribution of irregularly shaped electron beams. Pinhole measurements are made using a small aperture (<10% of the beam diameter) placed over a Faraday cup. The electron beam sweeps over the pinhole several times at regularly spaced intervals to provide enough information to map the power density distribution in the beam. The drawbacks of this technique are that variations in the side-to-side position of the beam on successive sweeps can lead to errors in the measured power density distribution, and that this device has a relatively low signal-to-noise ratio since the pinhole collects only a small percentage of the beam's current.

Computed tomography (CT) coupled with a modified Faraday cup (MFC) technique was developed at Lawrence Livermore National Laboratory as an improvement to the above methods for measuring the power density distribution of electron beams used for welding. The Lawrence Livermore National Laboratory device consists of a Faraday cup assembly placed underneath a tungsten disk containing an odd number of thin radially positioned slits (0.1 mm wide each), which is held above the Faraday cup by a cylindrical copper heat sink. During operation, the electron beam deflection coils are used to sweep the beam in a circle of known diameter and at a constant frequency over the tungsten slit disk. The majority of the beam current is intercepted by the tungsten disk and is conducted by the copper heat sink to ground. However, when the beam passes over a slit, only a portion of the beam current passes through the slit and into the Faraday cup where it can be measured as a voltage drop across a known resistor. A current versus time profile is collected using a fast sampling analog to digital converter as the beam passes over each slit. This beam profile information is used to CT reconstruct the power density distribution in the beam.

The Lawrence Livermore National Laboratory method has a number of advantages over these other techniques. For example, it is less sensitive to side-to-side variations in the beam position than pinholes, has a higher signal-to-noise ratio than pinholes since a substantially larger portion of the beam is captured during each sweep, and rapidly provides a quantitative measure of the power density distribution of the beam. Although this technique provides the most accurate measurement of the power density distribution of electron or other charged particle beams, it was designed for relatively large beams used for welding (>1 mA current, >0.1 mm diameter), and has slits too large to measure the properties of micro beams.

Referring now to the drawings and in particular to FIG. 1, an illustration of one embodiment of a diagnostic system for micro beams constructed in accordance with the present invention is shown. The diagnostic system is designated generally by the reference numeral 100. The system 100 includes structural components that provide a diagnostic system for micro beams for profiling low power micro beams. The diagnostic system 100 involves interconnected components or systems that broadly include an electron beam gun system for producing an electron beam 109, a micro modified Faraday cup (MFC) system generally indicated by the reference numeral 110, a positioning system generally indicated by the reference numeral 111, and a control and data acquisition system generally indicated by the reference numeral 112. The control and data acquisition system 112 is connected to the micro modified Faraday cup (MFC) system 110 and the positioning system 111 by the connecting lines 113 and 114.

The electron beam gun system is a system that may be used for micro-joining applications, or ion implantation or characterization. The electron beam gun system includes a filament 101, a Wehnelt Cup 102, an anode 103, a $1^{st}$ electron/condenser lens 104, a spray aperture 105, a $2^{nd}$ electron/condenser lens 106, an objective lens 107, and a lens aperture 108. The components are contained in vacuum chambers 115 and 116. In operation, the beam 109 is swept in a circular pattern across traces in the micro modified Faraday cup system 110. The beam 109 enters the traces in the micro modified Faraday cup system 110 and the system 100 provides diagnostics for profiling the beam 109. The control and data acquisition system 112 functions to control the micro modified Faraday cup (MFC) system 110 as well as processing and storing the acquired data. Various details and operations of the control and data acquisition system 112 will be described subsequently in connection with the operation of the diagnostic system 100. Basic details and structural elements of the control and data acquisition system 112 are not shown or discussed here because they are systems known in the art. Many of the elements of the diagnostic system 100 are the same as or similar to the systems shown and described in U.S. Pat. No. 5,382,895; U.S. Pat. No. 5,468,966; U.S. Pat. No. 5,554,926; U.S. Pat. No. 5,583,427; and U.S. Pat. No. 6,300,755. The disclosures of U.S. Pat. No. 5,382,895; U.S. Pat. No. 5,468,966; U.S. Pat. No. 5,554,926; U.S. Pat. No. 5,583,427; and U.S. Pat. No. 6,300,755 are incorporated herein by this reference.

The present invention provides a system 100 for characterization of the micro beam 109. The system 100 includes methods and apparatus for capturing multiple beam profiles at different radial angles in a fraction of a second as the beam is oscillated in a circular pattern over the MFC. The individual beam profiles are then reconstructed using a computed tomography method to render an image of the beam shape, size, and power density distribution. The present invention improves beam reconstruction by increasing the number of profiles taken in one oscillation of the beam. A second set of current collecting traces is interleaved with the first to effectively collect twice as much profile data. These electrically isolated traces are placed in recesses in a substrate in order to prevent cross-talk from backscattered electrons. The current collected by each set of traces is individually recorded by its dedicated data acquisition channel. The preprocessing portion of the computed tomography software combines the profiles obtained from the various channels into a form suitable for performing the computed tomography reconstruction.

Figure 2:
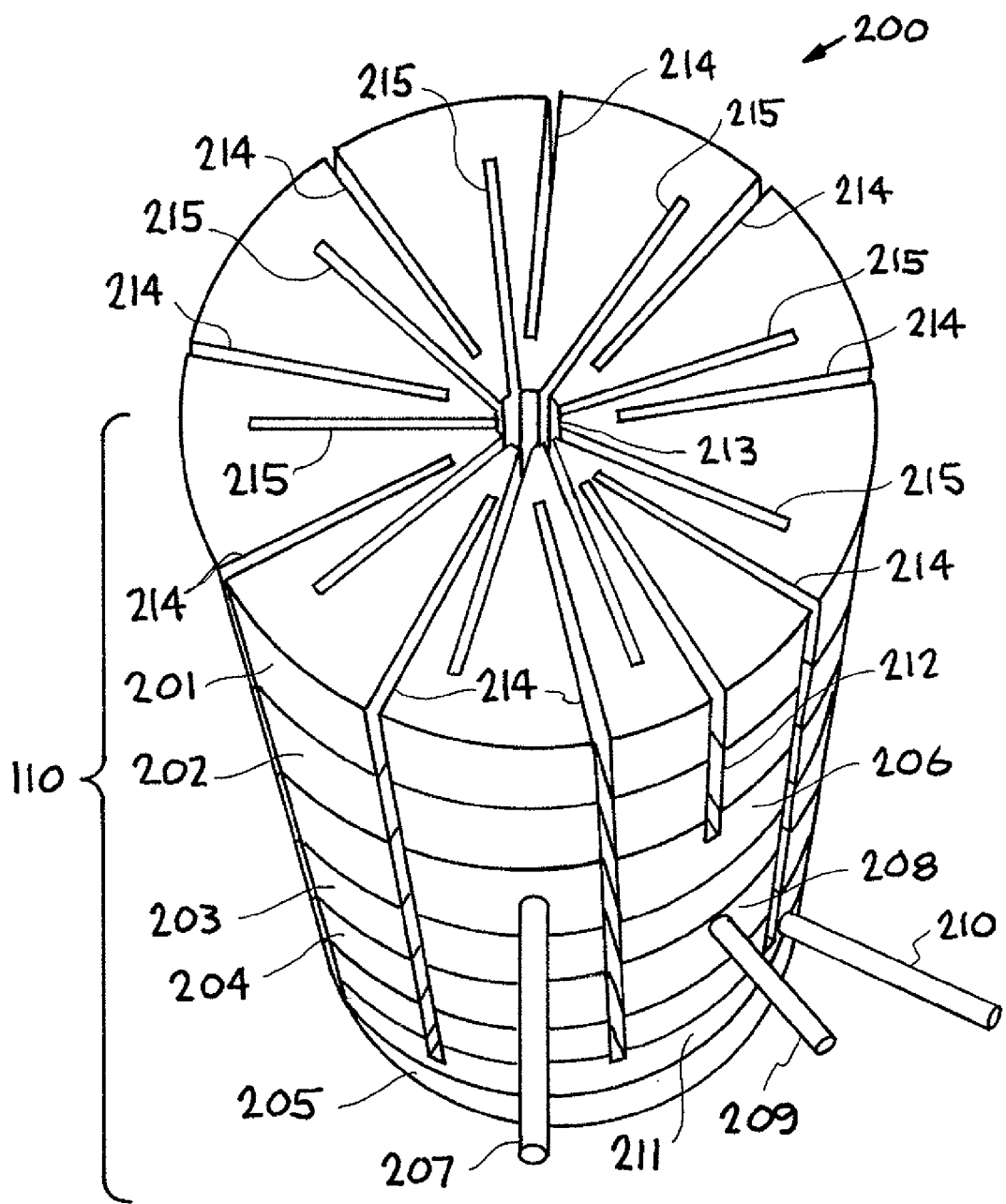
FIG. 2 is an illustration showing additional details of the diagnostic system for micro beams illustrated in FIG. 1.

Referring now to FIG. 2, an illustration shows details of one embodiment of the micro MFC system 110 illustrated in FIG. 1. The micro MFC system 110 is interconnected with components or systems that were described in connection with FIG. 1 including the electron beam gun system, the positioning system 111, and the control and data acquisition system. The micro MFC system 110 is positioned in the path of the micro beam 109. The overall view of the micro MFC system 110 is designated generally by the reference numeral 200. The micro MFC system 110 of this embodiment includes eight layers of material designated by the reference numerals 201, 202, 203, 204, 205, 206, 208, and 211 respectively. The top layer 201 is a refractory metal layer, where the beam 109 comes in contact with the diagnostic device 200.

The micro MFC system 110 includes two basic sets of traces 214 and 215 respectively. The two sets of traces 214 and 215 are located in radially positioned slits that penetrate the top refractory metal layer 201. The slits are aligned in the layers below to allow electrons to travel to and be collected by the traces 214 and 215. It is to be understood that more than two sets of traces are envisioned as part of the present invention and other embodiments of the invention include three or more sets of traces. The first set of circumferential radial traces 214 originates from the edge of the device 110 and extends inward. The second set of traces 215 originates from a center hole 213 and extends outward but not to the edge of the device 110. Each set of traces 214 and 215 comprises an odd number of traces and obtains a set of beam profiles independent from the other. The center hole 213 serves as a traditional Faraday Cup. An additional trace, trigger trace 212, originates from the edge of the device 110 and extends inward and acts as a data acquisition trigger for the device 110.

Referring again to FIG. 2, the micro MFC system 110 will be described in greater detail. Directly below the refractory metal layer 201 are seven alternating insulating and conducting layers. There are four insulating layers 202, 203, 204, and 208 and three conducting layers 206, 208, and 211. The insulating layers are located between the conducting layers. Conductors 207, 209, and 210 connect the three conducting layers 206, 208, and 211 to the computer tomography system illustrated as control and data acquisition system 112 in FIG. 1. Information from the conducting layers 206, 208, and 211 is transmitted through conductors 207, 209, and 210 to the control and data acquisition system 112, where the data are combined to produce a reconstruction of the beam. It is to be understood that more than eight layers are envisioned as part of the present invention and other embodiments of the invention include more than eight layers and that in some embodiments, less than eight layers are envisioned.

The trace 212 which is used as a trigger is embedded in a recess in the first conducting layer 206. The conductor 207 connects the first conducting layer 206 to the computer tomography system 112. The set of traces 215 which originate in the center of the device are embedded in recesses in the second conducting layer 208. The conductor 209 connects the second conducting layer 208 to the computer tomography system 112. The set of traces 214 originating from the edge of the device are embedded in recesses into the third conducting layer 211. The conductor 210 connects the third conducting layer 211 to the computer tomography system 112. Each conducting layer is therefore directly connected to its own data acquisition channel. The data obtained from each set of traces is sent to the computer tomography system 112, which is used to combine the data and produce a reconstruction of the beam. The bottom layer 205 of the device is an insulating layer.

The micro MFC system 110 captures multiple micro beam profiles at different radial angles in a fraction of a second as the beam is oscillated in a circular pattern over a micro diagnostic device. The individual beam profiles are then reconstructed using a computed tomographic method to render an image of the beam shape, size, and power density distribution. The data are gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines. The micro MFC system 110 has use for characterization of micro electron beams used for electron microscopy (scanning or transmission), micro charged particle beams used for micro-joining applications, micro ion beams or focused ion beams used for ion implantation or characterization. The micro MFC system 110 can be used for characterization of any charged particle beams used for lithography, or ion implantation on a micro scale.

The structural details of a system 100 for characterization of a micro beam having been described, the operation of the system illustrated in FIGS. 1 and 2 will now be considered. The micro modified Faraday cup assembly 110 comprises a micro modified Faraday cup assembly 110 in the form of a series of eight material layers with two sets of an odd number of thin, radially positioned traces 214 and 215 in the top layer. The odd number of traces assures that no two traces will be radially aligned opposite from each other. Some of the radially positioned traces 214 have uniform angular spacing and are extended to the edge of the micro modified Faraday cup device 110 and some of the radially positioned traces 215 have uniform angular spacing and are extended to the central portion, hole 213, of the micro modified Faraday cup device 110. The radially positioned traces 214 extending from the edge of the micro modified Faraday cup device 110 are electrically connected to form a first diagnostic network, and the radially positioned traces 215 extending from the central hole 213 of the micro modified Faraday cup device 110 are electrically connected to form a second diagnostic network. The traces of the two diagnostic networks are not angularly interleaved evenly, but in an alternating pattern with angles 25% and 75% of the uniform angular spacing of a given network of traces. The first diagnostic network and the second diagnostic network are used in a computed tomography method to render an image of the beam shape, size, and power density distribution.

In the method of the present invention, the beam 109 is swept in a circle of known diameter and at a constant frequency across both sets of radial traces 214 and 215. The beam 109 enters the trigger trace 212 and impinges upon the first conducting layer 206. This signal is transferred through the conductor 207 to the data acquisition and control system 112 and acts as a "trigger" which starts a predetermined process. Individual portions of the beam current pass through the various traces and are detected by each diagnostic network. For example, individual portions of the beam current can be detected by measuring voltage across a known resistor. A current versus time profile can be made using a fast sampling analog to digital converter as the beam passes over each trace. This beam profile information can be stored on a computer, which uses CT to reconstruct the power density distribution in the beam.

The system for characterization of a micro beam 100 allows the interleaving of at least a second set of radial traces that collect beam current which is read by a second DAQ device channel. This provides beam profile data independent of the first set. Because the two sets of data are independent, it does not matter if the two adjacent traces are sampling different portions of the beam simultaneously. As long as the profiles on a single DAQ device channel do not overlap, it will be possible to reconstruct the beam power density distribution. The data from the two channels are then combined for the CT reconstruction. It is also possible to interleave three or more sets of radial traces that collect beam current.

Each set of traces has its own independent DAQ device channels. Because the current collected by adjacent traces is recorded on separate channels, these traces may be closer together than a beam width without detrimentally affecting the measurement. The DAQ device channels will reside in the same computer system, allowing cross-timing that will enable the CT software to combine both sets of data for power density reconstruction. A conventional Faraday cup type structure is placed at the center of the centrally-connected traces to provide the ability to measure the total beam current.

A present invention also provides the ability to index each beam profile to the traces in order to determine the orientation of a non-circular beam. The present invention can incorporate a more straightforward approach making one of the slits and traces slightly wider than the others. The total current signal in a beam profile collected by this trace will be slightly larger than that collected by the other traces. The analysis of software can detect the larger signal and identify the profile belonging to the wide trace within the acquired data. Since the position of the other traces relative to the wide trace is known, the beam reconstruction can then be oriented relative to the known position of the wide trace within the chamber. The sets of beam profiles are combined to provide a reconstruction of the beam power density distribution with better spatial resolution than that available using a single set of traces. Another improvement is the trigger trace used to orient the reconstructions of non-circular beam within the equipment chamber.

The micro MFC device can be manufactured with different sized traces and different dimensions to measure the properties of different sized beams. Applicants chose a beam diameter of 1 micron as an example, but smaller or larger beams can be inspected with different sized micro MFCs. To scale the device up or down, the trace width should be no larger than 10% of the beam diameter for high resolution measurements. The diameter of the micro MFC needs to be large enough so that the beam doesn't pass through two traces in the same radial pattern simultaneously. Larger beams can be inspected with a given MFC as long as the beam diameter doesn't exceed the distance between traces, which can easily be determined from the number of the traces, their width and the diameter of the micro MFC device.

Micro beams with dimensions on the order of 1 micron diameter or smaller are expected to be used extensively for micro joining applications in the future. Beams of these dimensions or smaller are already used for electron beam lithography, micro characterization in scanning and transmission electron microscopy, and focused and micro ion beam implantation. All of these techniques and processes will benefit from a beam characterization technique that rapidly measures the quality of the electron or ion beam. Using a scanning electron microscope (SEM) as an example of a micro beam, Applicants scaled down the dimensions of the MFC diagnostic device to the dimensions required to be used on a 1 micron diameter beam having a maximum of 100 µA of current accelerated to 30 kV voltage. These operating parameters simulate the beam that can be generated on standard SEMs.

The diagnostic system 100 provides a system for rapidly measuring the power density distribution of a micro electron or an ion beam. The system captures multiple micro beam profiles at different radial angles in a fraction of a second as the beam is oscillated in a circular pattern over a micro diagnostic device. The individual beam profiles are then reconstructed using a computed tomographic method to render an image of the beam shape, size, and power density distribution. The data is gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

The diagnostic system 100 has use for characterization of micro electron beams used for electron microscopy (scanning or transmission), micro charged particle beams used for micro-joining applications, micro ion beams or focused ion beams used for ion implantation or characterization. The diagnostic system 100 can be used for characterization of any charged particle beams used for lithography, or ion implantation on a micro scale.

Figure 3:
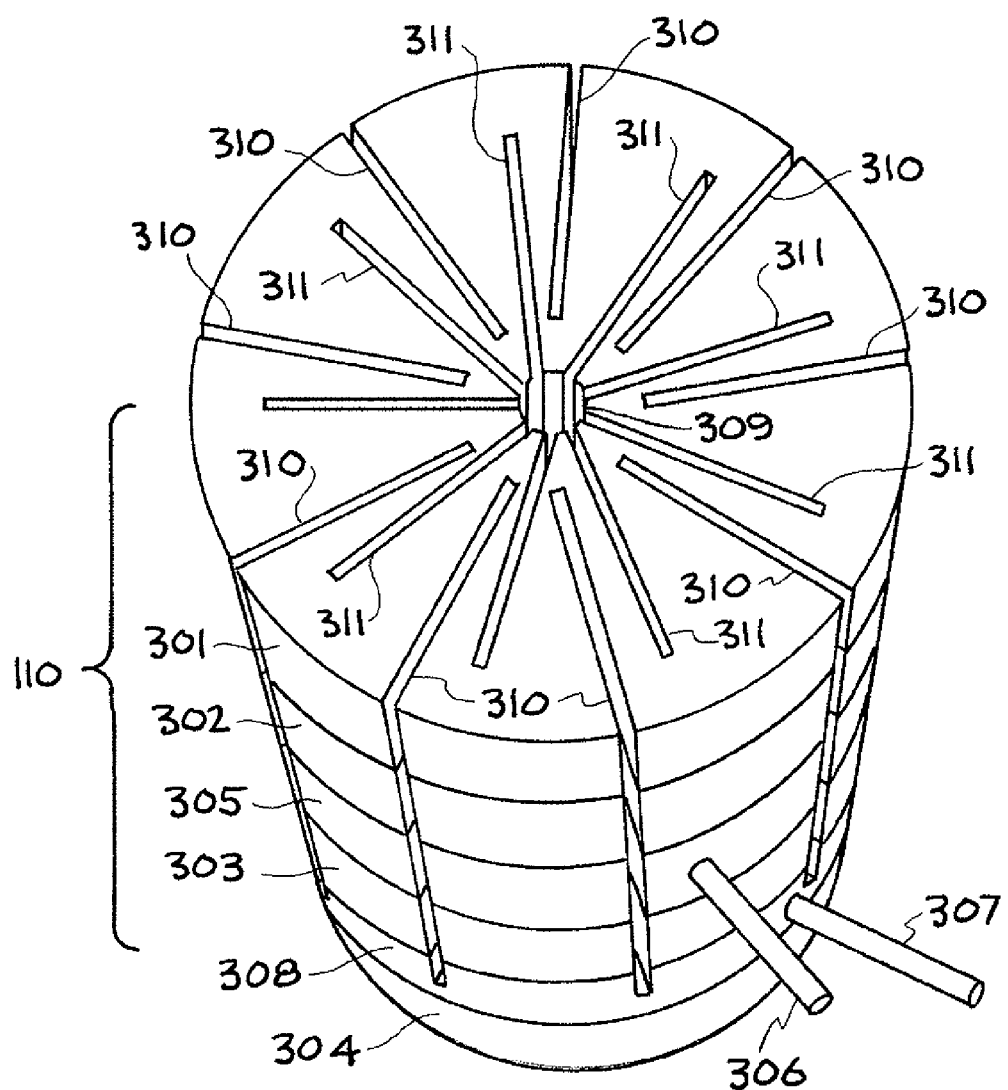
FIG. 3 illustrates another embodiment of a diagnostic system for micro beams constructed in accordance with the present invention.

Referring now to FIG. 3, an illustration shows details of another embodiment of a micro MFC system 110 illustrated in FIG. 1. This embodiment of the micro MFC system 110 includes two basic sets of traces 310 and 311, respectively. The two sets of traces 310 and 311 are located in radially positioned slits that penetrate the top refractory metal layer 301. The slits are aligned in the layers below to allow electrons to travel to and be collected by the traces 310 and 311. The first set of traces 310 are circumferential radial traces that originate from the edge of the device 110 and extend inward. The second set of traces 311 are traces that originate from a center hole 309 and extend outward, but do not extend to the edge of the device 110. Each set of traces 310 and 311 comprises an odd number of traces and obtains a set of beam profiles independent from the other. The center hole 309 serves as a traditional Faraday Cup.

Referring again to FIG. 3, the embodiment of a micro MFC system 110 will be described in greater detail. Directly below the refractory metal layer 301 are five alternating insulating and conducting layers. There are three insulating layers 302, 303, and 304 and two conducting layers 305 and 308. The insulating layers are located between the conducting layers. Conductors 306 and 307 connect the two conducting layers 305 and 308 to the computer tomography system illustrated as control and data acquisition system 112 in FIG. 1. Information from the conducting layers 305 and 308 is transmitted through conductors 306 and 307 to the control and data acquisition system 112, where the data are combined to produce a reconstruction of the beam.

The set of traces 311 which originate in the center of the device are embedded in recesses in the first conducting layer 305. The conductor 306 connects the first conducting layer 305 to the computer tomography system 112. The set of traces 310 originating from the edge of the device are embedded in recesses in the second conducting layer 308. The conductor 307 connects the second conducting layer 308 to the computer tomography system 112. Each conducting layer is therefore directly connected to its own data acquisition channel. The data obtained from each set of traces is sent to the computer tomography system 112, which is used to combine the data and produce a reconstruction of the beam. The bottom layer 304 of the device is an insulating layer.

The micro MFC system 110 captures multiple micro beam profiles at different radial angles in a fraction of a second as the beam is oscillated in a circular pattern over a micro diagnostic device. The individual beam profiles are then reconstructed using a computed tomographic method to render an image of the beam shape, size, and power density distribution. The data are gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines. The micro MFC system 110 has use for characterization of micro electron beams used for electron microscopy (scanning or transmission), micro charged particle beams used for micro-joining applications, micro ion beams or focused ion beams used for ion implantation or characterization. The micro MFC system 110 can be used for characterization of any charged particle beams used for lithography, or ion implantation on a micro scale.

The structural details of another embodiment of a system for characterization of a micro beam having been described, the operation of the system illustrated in FIG. 3 will now be considered. The micro modified Faraday cup assembly 110 comprises a micro modified Faraday cup assembly 110 in the form of a series of six material layers with two sets of an odd number of thin, radially positioned traces 310 and 311 in the top layer. The odd number of traces assures that no two traces will be radially aligned opposite from each other. Some of the radially positioned traces 310 have uniform angular spacing and are extended to the edge of the micro modified Faraday cup device 110 and some of the radially positioned traces 311 have uniform angular spacing and are extended to the central portion, hole 309, of the micro modified Faraday cup device 110. The radially positioned traces 310 extending from the edge of the micro modified Faraday cup device 110 are electrically connected to form a first diagnostic network, and the radially positioned traces 311 extending from the central hole 309 of the micro modified Faraday cup device 110 are electrically connected to form a second diagnostic network. The traces of the two diagnostic networks are not angularly interleaved evenly, but in an alternating pattern with angles 25% and 75% of the uniform angular spacing of the base network traces. The first diagnostic network and the second diagnostic network are used in a computed tomography method to render an image of the beam shape, size, and power density distribution.

In the method of the present invention, the beam 109 is swept in a circle of known diameter and at a constant frequency across both sets of radial traces 310 and 311.

Individual portions of the beam current pass through the various traces and are detected by each diagnostic network. For example, individual portions of the beam current can be detected by measuring voltage across a known resistor. A current versus time profile can be made using a fast sampling analog to digital converter as the beam passes over each trace. This beam profile information can be stored on a computer, which uses CT to reconstruct the power density distribution in the beam.

The system for characterization of a micro beam 100 allows the interleaving of at least a second set of radial traces to collect beam current data which are then read by a second DAQ device channel and provides beam profile data independent of the first set. Because the two sets of data are independent, it does not matter if the two adjacent traces are sampling different portions of the beam simultaneously. As long as the profiles on a single DAQ device channel do not overlap, it will be possible to reconstruct the beam power density distribution. The data from the two channels is then combined for the CT reconstruction. It is also possible to interleave three or more sets of radial traces that collect beam current.

Each set of traces has its own independent DAQ device channels. Because the current collected by adjacent traces is recorded on a separate channel, these traces may be closer together than a beam width without detrimentally affecting the measurement. The DAQ device channels will reside in the same computer system, allowing cross-timing that will enable the CT software to combine both sets of data for power density reconstruction. A conventional Faraday cup type structure is placed at the center of the centrally-connected traces to provide the ability to measure the total beam current.

A present invention also provides the ability to index each beam profile to the trace that collected it in order to determine the orientation of a non-circular beam. The present invention can incorporate a more straightforward approach making one of the slits and traces slightly wider than the others. The total current signal in a beam profile collected by this trace will be slightly larger than that collected by the other traces. The analysis software can detect the larger signal and identify the profile belonging to the wide trace within the acquired data. Since the position of the other traces relative to the wide trace is known, the beam reconstruction can then be oriented relative to the known position of the wide trace within the chamber. The sets of beam profiles are combined to provide a reconstruction of the beam power density distribution with better spatial resolution than that available using a single set of traces.

The micro MFC device can be manufactured with different sized traces and different dimensions to measure the properties of different sized beams. Applicants chose a beam diameter of 1 micron as an example, but smaller or larger beams can be inspected with different sized micro MFCs. To scale the device up or down, the trace width should be no larger than 10% of the beam diameter for high resolution measurements. The diameter of the micro MFC needs to be large enough so that the beam doesn't pass through two traces simultaneously. Larger beams can be inspected with a given MFC as long as the beam diameter doesn't exceed the distance between traces, which can easily be determined from the number of the traces, their width and the diameter of the micro MFC device.

Micro beams with dimensions on the order of 1 micron diameter or smaller are expected to be used extensively for micro joining applications in the future. Beams of these dimensions or smaller are already used for electron beam lithography, micro characterization in scanning and transmission electron microscopy, and focused and micro ion beam implantation. All of these techniques and processes will benefit from a beam characterization technique that rapidly measures the quality of the electron or ion beam. Using a scanning electron microscope (SEM) as an example of a micro beam, Applicants scaled down the dimensions of the MFC diagnostic device to the dimensions required to be used on a 1 micron diameter beam having a maximum of 100 $\mu$A of current accelerated to 30 kV voltage. These operating parameters simulate the beam that can be generated on standard SEMs.

The diagnostic system 100 provides a system for rapidly measuring the power density distribution of a micro electron or an ion beam. The system captures multiple micro beam profiles at different radial angles in a fraction of a second as the beam is oscillated in a circular pattern over a micro diagnostic device. The individual beam profiles are then reconstructed using a computed tomographic method to render an image of the beam shape, size, and power density distribution. The data are gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

The diagnostic system 100 has use for characterization of micro electron beams used for electron microscopy (scanning or transmission), micro charged particle beams used for micro-joining applications, micro ion beams or focused ion beams used for ion implantation or characterization. The diagnostic system 100 can be used for characterization of any charged particle beams used for lithography, or ion implantation on a micro scale.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An apparatus for characterization of a micro beam, comprising:
   a micro modified Faraday cup body positioned in the path of the micro beam, said micro modified Faraday cup body having a center hole and said micro modified Faraday cup body including an outer portion located radially outward from said center hole and an inner portion located radially outward from said center hole and having
   a first radially positioned set of traces located in said outer portion of said micro modified Faraday cup body,
   a second radially positioned set of traces located in said inner portion of said micro modified Faraday cup body,
   a first measuring diagnostic network in said modified Faraday cup body operatively connected to said first radially positioned set of traces and positioned to detect the micro beam that passes through said first radially positioned set of traces, and a second measuring diagnostic network in said modified Faraday cup body operatively connected to said second radially positioned set of traces and positioned to detect the micro beam that passes through said second radially positioned set of traces.

2. The apparatus for characterization of a micro beam of claim 1 wherein said first radially positioned set of traces comprises an odd number of radially positioned traces located in said outer portion of said micro modified Faraday cup body.

3. The apparatus for characterization of a micro beam of claim 1 wherein said second radially positioned set of traces comprises an odd number of radially positioned traces located in said inner portion of said micro modified Faraday cup body.

4. The apparatus for characterization of a micro beam of claim 1 including an additional radially positioned trace in said micro modified Faraday cup body that serves as a data acquisition trigger trace.

5. The apparatus for characterization of a micro beam of claim 4 wherein said additional radially positioned trace in said micro modified Faraday cup body that serves as a trigger trace comprises a radially positioned trace located in said outer portion of said micro modified Faraday cup body.

6. The apparatus for characterization of a micro beam of claim 1 wherein the beam has a diameter and the width of said first radial traces is approximately 10% or less of said diameter of the beam.

7. The apparatus for characterization of a micro beam of claim 1 wherein the beam has a diameter and the width of said second traces is approximately 10% or less of said diameter of the beam.

8. The apparatus for characterization of a micro beam of claim 1 wherein the beam has a diameter and the width of said first radial traces and the width of said second traces are approximately 10% or less of said diameter of the beam.

9. The apparatus for characterization of a micro beam of claim 1 including at least one additional set of radially positioned traces in said micro modified Faraday cup body.

10. An apparatus for characterization of a micro beam, comprising:
a micro modified Faraday cup body positioned in the path of the micro beam, said micro modified Faraday cup body having a center hole and said micro modified Faraday cup body including an outer portion located radially outward from said center hole and an inner portion located radially outward from said center hole and having
a first radially positioned set of traces located in said outer portion of said micro modified Faraday cup body,
a second radially positioned set of traces located in said inner portion of said micro modified Faraday cup body,
first measuring diagnostic network means in said modified Faraday cup body operatively connected to said first radially positioned set of traces for detecting the micro beam that passes through said first radially positioned set of traces, and
second measuring diagnostic network means in said modified Faraday cup body operatively connected to said second radially positioned set of traces detecting the micro beam that passes through said second radially positioned set of traces.

11. The apparatus for characterization of a micro beam of claim 10 wherein said first radially positioned set of traces comprises an odd number of radially positioned traces located in said outer portion of said micro modified Faraday cup body.

12. The apparatus for characterization of a micro beam of claim 10 wherein said second radially positioned set of traces comprises an odd number of radially positioned traces located in said inner portion of said micro modified Faraday cup body.

13. The apparatus for characterization of a micro beam of claim 10 including an additional radially positioned trace in said micro modified Faraday cup body that serves as a data acquisition trigger trace.

14. The apparatus for characterization of a micro beam of claim 13 wherein said additional radially positioned trace in said micro modified Faraday cup body that serves as a trigger trace comprises a radially positioned trace located in said outer portion of said micro modified Faraday cup body.

15. The apparatus for characterization of a micro beam of claim 10 wherein the beam has a diameter and the width of said first radial traces is approximately 10% or less of said diameter of the beam.

16. The apparatus for characterization of a micro beam of claim 10 wherein the beam has a diameter and the width of said second traces is approximately 10% or less of said diameter of the beam.

17. The apparatus for characterization of a micro beam of claim 10 wherein the beam has a diameter and the width of said first radial traces and the width of said second traces are approximately 10% or less of said diameter of the beam.

18. The apparatus for characterization of a micro beam of claim 10 including at least one additional set of radially positioned traces in said micro modified Faraday cup body.

19. A method for the characterization of a micro beam, comprising the steps of:
providing a micro modified Faraday cup body having a micro modified Faraday cup body positioned in the path of the micro beam, said micro modified Faraday cup body having a center hole,
providing a radial outer portion in said micro modified Faraday cup body located radially outward from said center hole,
providing an inner portion in said micro modified Faraday cup body located radially outward from said center hole,
providing a first radially positioned set of traces located in said outer portion of said micro modified Faraday cup body,
providing a second radially positioned set of traces located in said inner portion of said micro modified Faraday cup body,
providing a first measuring diagnostic network in said modified Faraday cup body operatively connected to said first radially positioned set of traces and positioned to detect the micro beam that passes through said first radially positioned set of traces,
providing a second measuring diagnostic network in said modified Faraday cup body operatively connected to said second radially positioned set of traces and positioned to detect the micro beam that passes through said second radially positioned set of traces;
directing the micro beam through said first radially positioned set of traces where it is detected by said first measuring diagnostic network; and
directing the micro beam through said second radially positioned set of traces where it is detected by said second measuring diagnostic network.

20. The method for the characterization of a micro beam of claim 19 including combining said first measuring diagnostic network and said second measuring diagnostic network.

21. The method for the characterization of a micro beam of claim 20 including using a computed tomography algorithm to reconstruct the beam shape.

22. The method for the characterization of a micro beam of claim 19 including using a computed tomography algorithm to reconstruct the beam size.

23. The method for the characterization of a micro beam of claim 19 including using a computed tomography algorithm to reconstruct the beam power density distribution.

24. The method for the characterization of a micro beam of claim 19 including using a computed tomography algorithm to reconstruct the beam shape, size, and power density distribution.

25. The method for the characterization of a micro beam of claim 19 including using a computed tomography algorithm to correct micro beam astigmatism.

26. The method for the characterization of a micro beam of claim 19 including using a computed tomography algorithm to correct micro beam effects leading to non-symmetric beams.

27. The method for the characterization of a micro beam of claim 19 including using a computed tomography algorithm to correct micro beam effects leading to non-optimum beams.

28. The method for the characterization of a micro beam of claim 19 including using a computed tomography algorithm to correct micro beam problems including focusing irregularities, beam astigmatism, and other effects leading to non-symmetric or non-optimum beams.

29. The method for the characterization of a micro beam of claim 19 including using a computed tomography algorithm to provide a permanent record of the micro beam.

30. The method for the characterization of a micro beam of claim 19 including using a computed tomography algorithm to provide a permanent record of the micro beam for quality control.

31. The method for the characterization of a micro beam of claim 19 including using a computed tomography algorithm to provide a system for repeating the same micro beam quality on the same machine over a period of time.

32. The method for the characterization of a micro beam of claim 19 including using a computed tomography algorithm to provide a permanent record of the micro beam to provide a system for transferring the micro beam quality characteristics to multiple machines.

33. The method for the characterization of a micro beam of claim 19 including using a computed tomography algorithm to provide a permanent record of the micro beam for documentation of uses made of the micro beam.

* * * * *